United States Patent
Wu et al.

(10) Patent No.: US 11,798,572 B2
(45) Date of Patent: Oct. 24, 2023

(54) METHOD AND APPARATUS FOR IMPROVING SIGNAL-TO-NOISE RATIO OF MICROPHONE SIGNAL

(71) Applicant: YEALINK (XIAMEN) NETWORK TECHNOLOGY CO., LTD., Fujian (CN)

(72) Inventors: Lang Wu, Fujian (CN); Jiaxiang Liao, Fujian (CN); Chaofan Zeng, Fujian (CN)

(73) Assignee: YEALINK (XIAMEN) NETWORK TECHNOLOGY CO., LTD., Xiamen (CN)

( * ) Notice: Subject to any disclaimer, the term of this patent is extended or adjusted under 35 U.S.C. 154(b) by 42 days.

(21) Appl. No.: 17/588,219

(22) Filed: Jan. 29, 2022

(65) Prior Publication Data

US 2022/0254363 A1 Aug. 11, 2022

(30) Foreign Application Priority Data

Feb. 7, 2021 (CN) .......................... 202110181979.7

(51) Int. Cl.
| | |
|---|---|
| H04R 3/00 | (2006.01) |
| G10L 21/0232 | (2013.01) |
| H03F 3/45 | (2006.01) |
| H03G 3/30 | (2006.01) |
| H04R 1/40 | (2006.01) |
| H04R 3/04 | (2006.01) |
| G10L 21/0216 | (2013.01) |

(52) U.S. Cl.
CPC ...... *G10L 21/0232* (2013.01); *H03F 3/45475* (2013.01); *H03G 3/3005* (2013.01); *H04R 1/406* (2013.01); *H04R 3/005* (2013.01); *H04R 3/04* (2013.01); *G10L 2021/02166* (2013.01); *H03F 2200/03* (2013.01); *H03G 2201/103* (2013.01); *H04R 2410/01* (2013.01)

(58) Field of Classification Search
CPC ....... G10L 21/0232; G10L 2021/02166; H03F 3/45475; H03F 2200/03; H03G 3/3005; H04R 3/005; H04R 3/04; H04R 2410/01
USPC ..................................... 381/92, 122
See application file for complete search history.

(56) References Cited

U.S. PATENT DOCUMENTS

| | | | | |
|---|---|---|---|---|
| 10,741,164 | B1 * | 8/2020 | Honda | H04R 3/005 |
| 2009/0086578 | A1 * | 4/2009 | Sugiyama | G01S 3/808 |
| | | | | 367/138 |
| 2016/0379664 | A1 * | 12/2016 | Chen | G10L 21/0264 |
| | | | | 381/94.3 |
| 2022/0130417 | A1 * | 4/2022 | Seltzer | A01K 15/022 |

FOREIGN PATENT DOCUMENTS

CN 103813227 A * 5/2014

* cited by examiner

*Primary Examiner* — Ammar T Hamid

(57) ABSTRACT

Disclosed are a method and apparatus for improving a signal-to-noise ratio of a microphone signal. The method includes: selecting a target microphone to be improved as a first microphone, and selecting a microphone whose signal-to-noise ratio is greater than a signal-to-noise ratio of the first microphone and exceeds a preset first threshold as a second microphone; and adding, by an adder, a voice signal of the first microphone and a voice signal of the second microphone in a case that a same voice signal is inputted, to obtain a first microphone signal whose signal-to-noise ratio has been improved.

10 Claims, 3 Drawing Sheets

---

Select a target microphone to be improved as a first microphone, and select a microphone whose SNR is greater than a SNR of the first microphone and exceeds a preset first threshold as a second microphone — S1

Add, by an adder, a voice signal of the first microphone and a voice signal of the second microphone in a case that the same voice signal is inputted, to obtain a first microphone signal whose SNR has been improved — S2

METHOD AND APPARATUS FOR IMPROVING SIGNAL-TO-NOISE RATIO OF MICROPHONE SIGNAL

CROSS-REFERENCE TO RELATED APPLICATION

The present application claims the benefit of Chinese Patent Application No. 202110181979.7 filed on Feb. 7, 2021, the contents of which are hereby incorporated by reference.

TECHNICAL FIELD

The present disclosure relates to the field of signal processing technologies, and in particular, to a method and apparatus for improving a signal-to-noise ratio of a microphone signal.

BACKGROUND ART

A microphone is mainly used to acquire natural sound signals. It outputs useful sound signals, and at the same time generates corresponding noise signals. A ratio of signal power outputted by the microphone to noise power (noise floor of the microphone) outputted by the microphone is called a signal-to-noise ratio (SNR). The SNR, which is typically determined by a manufacturing process and an internal structure of the microphone itself, is a fixed value after the microphone has been produced. In view of this, the SNR is an important parameter that needs to be considered when selecting a microphone.

However, in an actual application, an already selected microphone may have a SNR which cannot satisfy a system requirement. Thus, a technical problem to be solved is to improve the SNR of the already selected microphone, so as to make an improved SNR to satisfy the system requirement and improve sound quality.

SUMMARY

An objective of the present disclosure is to provide a method and apparatus for improving a signal-to-noise ratio of a microphone signal, which can improve a signal-to-noise ratio of a microphone with a poor signal-to-noise ratio.

According to a first aspect, the present disclosure provides a method for improving a signal-to-noise ratio of a microphone signal, including at least the following steps: selecting a target microphone to be improved as a first microphone, and selecting a microphone whose SNR is greater than a SNR of the first microphone and exceeds a preset first threshold as a second microphone; and adding, by an adder, a voice signal of the first microphone and a voice signal of the second microphone in a case that a same voice signal is inputted, to obtain a first microphone signal whose SNR has been improved.

In an embodiment, the adding, by an adder, a voice signal of the first microphone and a voice signal of the second microphone in a case that a same voice signal is inputted, to obtain a first microphone signal whose SNR has been improved includes: adding, by the adder, an entire frequency band voice signal of the first microphone and an entire frequency band voice signal of the second microphone, to obtain the first microphone signal whose signal-to-noise ratio has been improved.

In an embodiment, the adding, by an adder, a voice signal of the first microphone and a voice signal of the second microphone in a case that a same voice signal is inputted, to obtain a first microphone signal whose SNR has been improved includes: using frequency selective filters to respectively select a target frequency band voice signal of the first microphone and a target frequency band voice signal of the second microphone, in a case that the same voice signal is inputted; and adding, by the adder, the target frequency band voice signal of the first microphone and the target frequency band voice signal of the second microphone, to obtain a first microphone signal whose SNR has been improved.

In an embodiment, the method further includes: selecting a microphone whose SNR is greater than a SNR of the first microphone whose SNR has been improved and exceeds a preset second threshold as a third microphone; and adding, by the adder, an entire frequency band voice signal of the first microphone whose SNR has been improved and an entire frequency band voice signal of the third microphone, to obtain a first microphone signal whose SNR has been improved once more.

In an embodiment, the method further includes: selecting a microphone whose SNR is greater than a SNR of the first microphone whose SNR has been improved and exceeds a preset second threshold as a third microphone; using frequency selective filters to respectively select a target frequency band voice signal of the first microphone whose SNR has been improved and a target frequency band voice signal of the third microphone, in a case that the same voice signal is inputted; and adding, by the adder, the target frequency band voice signal of the first microphone whose SNR has been improved and the target frequency band voice signal of the third microphone, to obtain a first microphone signal whose SNR has been improved once more.

In an embodiment, the frequency selective filters each includes a digital filter and an analog filter.

In an embodiment, the adder includes a digital adder and an analog operational amplifier adder.

According to a second aspect, the present disclosure provides an apparatus for improving a signal-to-noise ratio of a microphone signal, including a microphone selection module and a first SNR improvement module. The microphone selection module is configured to select a target microphone to be improved as a first microphone, and select a microphone whose SNR is greater than a SNR of the first microphone and exceeds a preset first threshold as a second microphone. The first SNR improvement module is configured to add, by an adder, a voice signal of the first microphone and a voice signal of the second microphone in a case that a same voice signal is inputted, to obtain a first microphone signal whose SNR has been improved.

In an embodiment, the first SNR improvement module includes an entire frequency band first signal-to-noise ratio improvement module. The entire frequency band first signal-to-noise ratio improvement module is configured to add, by the adder, an entire frequency band voice signal of the first microphone and an entire frequency band voice signal of the second microphone, to obtain the first microphone signal whose signal-to-noise ratio has been improved.

In an embodiment, the first SNR improvement module includes a target frequency band first SNR improvement module. The target frequency band first SNR improvement module is configured to use frequency selective filters to respectively select a target frequency band voice signal of the first microphone and a target frequency band voice signal of the second microphone, in a case that the same voice signal is inputted; and add, by the adder, the target frequency band voice signal of the first microphone and the target frequency band voice signal of the second microphone, to obtain a first microphone signal whose SNR has been improved.

In an embodiment, the apparatus further includes an entire frequency band second SNR improvement module. The microphone selection module is further configured to select a microphone whose SNR is greater than a SNR of the first microphone whose SNR has been improved and exceeds a preset second threshold as a third microphone. The entire frequency band second SNR improvement module is configured to add, by the adder, an entire frequency band voice signal of the first microphone whose SNR has been improved and an entire frequency band voice signal of the third microphone, to obtain a first microphone signal whose SNR has been improved once more.

In an embodiment, the apparatus further includes a target frequency band second SNR improvement module. The microphone selection module is further configured to select a microphone whose SNR is greater than a SNR of the first microphone whose SNR has been improved and exceeds a preset second threshold as a third microphone. The target frequency band second SNR improvement module is configured to use frequency selective filters to respectively select a target frequency band voice signal of the first microphone whose SNR has been improved and a target frequency band voice signal of the third microphone, in a case that the same voice signal is inputted; and add, by the adder, the target frequency band voice signal of the first microphone whose SNR has been improved and the target frequency band voice signal of the third microphone, to obtain a first microphone signal whose SNR has been improved once more.

The embodiments of the present disclosure have at least the following beneficial effects.

Compared with the related art, the present disclosure synthesizes a voice signal by adding the voice signals of two microphones with a relatively large difference in their SNRs, which can effectively improve the SNR of the voice signal acquired by the first microphone, thereby obtaining better sound quality. Further, the present disclosure adds the signal in the target frequency band of the first microphone with the signal in the corresponding frequency band of second microphone, so as to maintain an original performance characteristic of the first microphone and at the same time improve the SNR of the voice signal.

DETAILED DESCRIPTION OF THE EMBODIMENTS

The technical solutions in the embodiments of the present disclosure will be clearly and completely described with reference to accompanying drawings. Obviously, the described embodiments are merely a part of the embodiments of the present disclosure, rather than all of the embodiments. Based on the embodiments in the present disclosure, all other embodiments obtained by those skilled in the art without creative work shall fall within the protection scope of the present disclosure.

In the present disclosure, the terms "first", "second", etc. are merely used for description, and cannot be interpreted as indicating or implying relative importance or implicitly indicating the number of indicated technical features. Thus, the features defined with "first", "second", etc. may explicitly or implicitly include one or more of these features. In the present disclosure, unless otherwise specified, "plurality" means two or more.

SNR: an abbreviation for signal-to-noise ratio. It represents a ratio of a useful signal outputted by a microphone to a noise level outputted by the microphone.

MIC: an abbreviation for microphone. It is a transducer that converts sound into an electrical signal, which is widely used in audio collection circuits of telephones, voice recognition equipment, music recording equipment, etc.

According to an aspect, the present disclosure provides a method for improving a signal-to-noise ratio of a microphone signal, which can effectively improve the SNR of the microphone signal, thereby enhancing sound quality.

Figure 1:
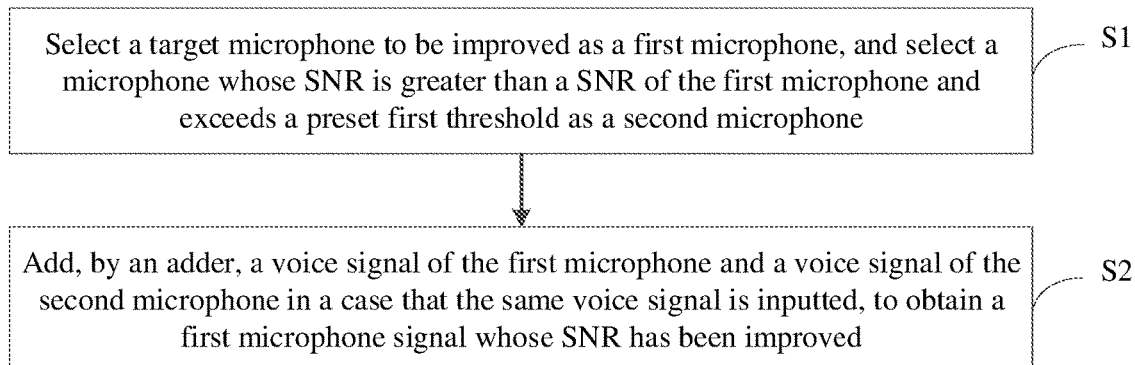
FIG. 1 is a schematic flowchart of a method for improving a signal-to-noise ratio of a microphone signal according to an embodiment of the present disclosure.

As shown in FIG. 1, this embodiment provides a method for improving a signal-to-noise ratio of a microphone signal, including at least the following steps:

S1. Select a target microphone to be improved as a first microphone, and select a microphone whose SNR is greater than a SNR of the first microphone and exceeds a preset first threshold as a second microphone.

Specifically, in step S1, a MIC A to be improved is selected, whose output signal is $S_a$ and output noise is $N_a$. The selected MIC A is generally irreplaceable. A MIC B is selected to add to the MIC A, in order to improve a SNR of the MIC A. A SNR of the MIC B is much greater than the SNR of the MIC A. Generally, the preset first threshold is more than about 20 dB. In addition, the MIC B is generally universal and cheap.

S2. Add, by an adder, a voice signal of the first microphone and a voice signal of the second microphone in a case that the same voice signal is inputted, to obtain a first microphone signal whose SNR has been improved.

Specifically, in step S2, the selected MIC B has an output signal as $S_b$, and an output noise as $N_b$. Since the difference between the SNR of the MIC A and the SNR of the MIC B is relatively large, $N_b$ is much smaller than $N_a$ in a case of the same output signal S.

The original SNR of the MIC A is $$SNR_a = \frac{S_a}{N_a},$$

and the original SNR of the MIC B is $$SNR_b = \frac{S_b}{N_b}.$$

A signal after the signal addition of the MIC A and the MIC B is $S_{ab}=S_a+S_b$, and a noise after the signal addition of the MIC A and the MIC B is $N_{ab}=N_a+N_b$.

Since $S_a=S_b=S$, $S_{ab}=S_a+S_b=2S$.

Since $N_b$ is much smaller than $N_a$, $N_b$ is negligible relative to $N_a$, and $N_{ab}=N_a$.

A SNR after the signal addition of the MIC A and the MIC B is $$SNR_{ab} = \frac{S_{ab}}{N_{ab}} = \frac{2S}{N_a} = 2SNR_a.$$

From above, the SNR after the signal addition of the MIC A and the MIC B is improved by $$20\text{LOG}\frac{SNR_{ab}}{SNR_a} = 6 \text{ dB}.$$

Thus, in this case, the voice signal acquired after the signal addition of the MIC A and the MIC B not only has the characteristic of the MIC A, but at the same time has an increase in the SNR by 6 dB over an entire frequency band.

Figure 2:
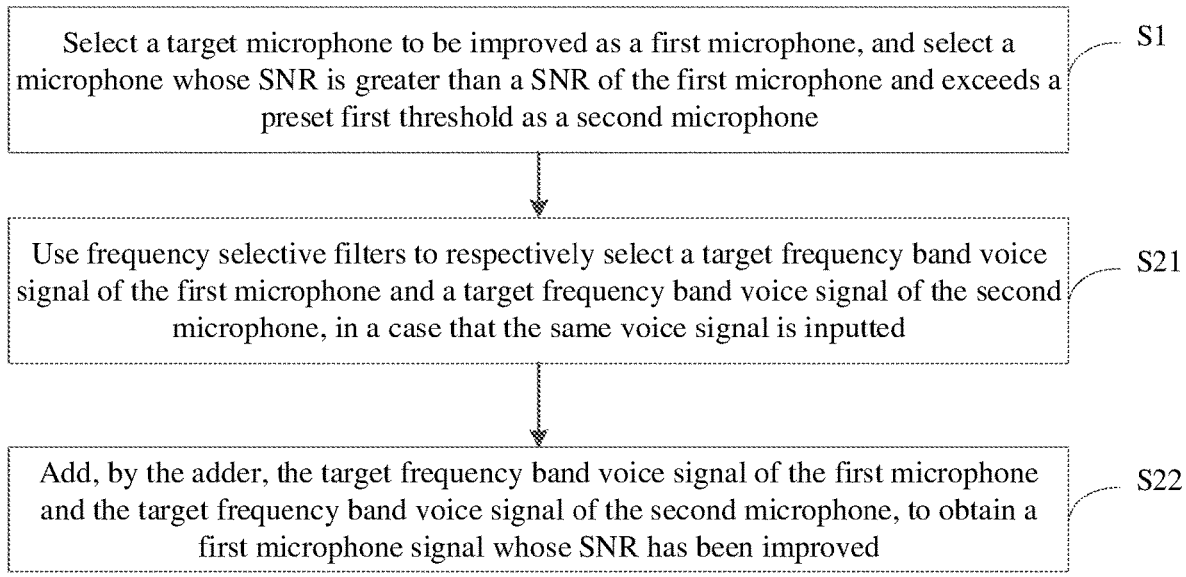
FIG. 2 is a schematic flowchart of a method for improving a signal-to-noise ratio of a microphone signal according to another embodiment of the present disclosure.

In an embodiment, as shown in FIG. 2, step S2 includes:

S21. Use frequency selective filters to respectively select a target frequency band voice signal of the first microphone and a target frequency band voice signal of the second microphone, in a case that the same voice signal is inputted.

S22. Add, by the adder, the target frequency band voice signal of the first microphone and the target frequency band voice signal of the second microphone, to obtain the first microphone signal whose SNR has been improved.

Figure 3:
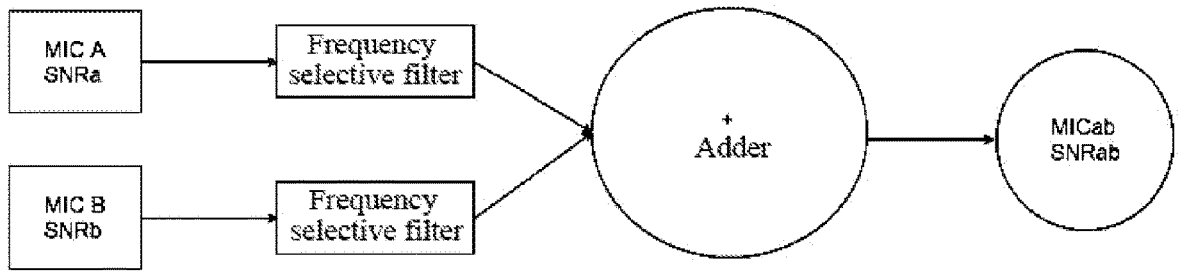
FIG. 3 is a schematic diagram of particular frequency band signal addition according to an embodiment of the present disclosure.

In a case that the MIC A has a special function and is irreplaceable, if an entire frequency band signal addition of the MIC A and the MIC B, namely adding the entire frequency band voice signal of the MIC A with the entire frequency band voice signal of the MIC B, results in the reduced performance of the MIC A, it is not suitable to perform such signal addition. Thus, according to the specific function of the MIC A, the signal addition of the MIC A and the MIC B may be performed over a particular frequency band of the MIC A. The particular frequency band of the MIC A has a small influence on the specific function of the MIC A and has a relatively low SNR. For example, as shown in FIG. 3, the frequency selective filters, such as a first frequency selective filter and a second frequency selective filter, respectively select the target frequency band voice signal of the first microphone and the target frequency band voice signal of the second microphone; then, the adder adds the target frequency band voice signal of the first microphone and the target frequency band voice signal of the second microphone, to obtain the first microphone signal whose SNR has been improved over the particular frequency band. The frequency selective filters are selected according to the particular frequency band to be improved. Different filters correspond to different frequency bands of the first microphone that are to be improved. A basic selection principle is that a signal in a frequency band of the first microphone that needs the SNR improvement is added with a signal in the corresponding frequency band of the second microphone.

This embodiment performs the particular frequency band signal addition, namely adding the target frequency band voice signal of the first microphone and the target frequency band voice signal of the second microphone, which maintains the original performance characteristic of the first microphone and at the same time improves the SNR of the voice signal of the first microphone.

For example, the MIC A has a high requirement for the SNR in a low frequency band, while the MIC B does not have such high requirement for a special function in the low frequency band. In this case, only the SNR in the low frequency band (e.g., 0 Hz to 500 Hz) of the MIC A needs to be improved. Specifically, the voice signal in the frequency band from 0 Hz to 500 Hz of the MIC A is added with the voice signal in the frequency band from 0 Hz to 500 Hz of the MIC B which has a relatively high SNR. After the signal addition, the MIC A has an improved SNR over the frequency band from 0 Hz to 500 Hz and also maintains its original performance characteristic. That is, the SNR in the low frequency band of the MIC A has been improved by 6 dB, and the special function of the MIC A has also been well maintained.

For example, only the SNR in the low frequency band (e.g., 0 Hz to 500 Hz) of the MIC A is to be improved. In this case, the filter of the MIC A allows the voice signal in the entire frequency band of the MIC A to pass, while the filter of the MIC B is a 500 Hz low-pass filter, which only allows the voice signal below 500 Hz of the MIC B to pass. Then, the voice signal below 500 Hz of the MIC B is selected to add with the voice signal of the MIC A. Specifically, the voice signal below 500 Hz of the MIC A is added with the voice signal below 500 Hz of the MIC B, and the voice signal above 500 Hz of the MIC A remains unchanged.

For another example, only the SNR in the low frequency band (e.g., 0 Hz to 500 Hz) of the MIC A is to be improved, and at the same time, only the voice signal in the low frequency band of the MIC A needs to be output. In this case, the filters of the MIC A and the MIC B are both 500 Hz low-pass filters. Then, the voice signal below 500 Hz of the MIC A is added with the voice signal below 500 Hz of the MIC B.

In an embodiment, the frequency selective filter includes a digital filter and an analog filter. The frequency selective filter is mainly configured to select useful signals in different frequency bands of a MIC when performing the particular frequency band signal addition.

In an embodiment, the adder includes a digital adder and an analog operational amplifier adder.

In an embodiment, the method further includes:

selecting a microphone whose SNR is greater than a SNR of the first microphone whose SNR has been improved and exceeds a preset second threshold as a third microphone; and adding, by the adder, an entire frequency band voice signal of the first microphone whose SNR has been improved and an entire frequency band voice signal of the third microphone, to obtain a first microphone signal whose SNR has been improved once more.

Specifically, if the $SNR_{ab}$ after the signal addition of the first microphone and the second microphone over the entire frequency band or over the particular frequency band still fails to satisfy a requirement, the signal addition may be performed again with a MIC C over the entire frequency band. The $SNR_C$ is much greater than $SNR_{ab}$, to ensure another 6 dB improvement. The third microphone whose $SNR_C$ is much greater than $SNR_{ab}$ is selected; then, the entire frequency band voice signal of the first microphone whose SNR has been improved is added with the entire frequency band voice signal of the third microphone by the adder, to obtain the first microphone signal whose SNR has been improved once more over the entire frequency band. This embodiment is not limited to using the third microphone for improving the SNR once more, and is also suitable for performing the signal addition with a plurality of microphones. The SNR of the third microphone must be greater than the SNR of the first microphone whose SNR has been improved, to ensure a significant improvement. In addition, these steps may be repeated as needed, thereby further improving the SNR and sound quality of the first microphone.

In an embodiment, the method further includes:

selecting a microphone whose SNR is greater than a SNR of the first microphone whose SNR has been improved and exceeds a preset second threshold as a third microphone; and using frequency selective filters to respectively select a target frequency band voice signal of the first microphone whose SNR has been improved and a target frequency band voice signal of the third microphone, in a case that the same voice signal is inputted; and adding, by the adder, the target frequency band voice signal of the first microphone whose SNR has been improved and the target frequency band voice signal of the third microphone, to obtain a first microphone signal whose SNR has been improved once more.

Specifically, if the $SNR_{ab}$ after the signal addition of the first microphone and the second microphone over the entire frequency band or over the particular frequency band still fails to satisfy a requirement, the signal addition may be performed again with a MIC C over the particular frequency band. The $SNR_C$ is much greater than $SNR_{ab}$, to ensure another 6 dB improvement. The third microphone whose $SNR_C$ is much greater than $SNR_{ab}$ is selected; the frequency selective filters are used to respectively select the target frequency band voice signal of the first microphone after the entire frequency band signal addition or the particular frequency band signal addition and the target frequency band voice signal of the third microphone; the target frequency band voice signal of the first microphone whose SNR has been improved and the target frequency band voice signal of the third microphone are added by the adder, to obtain the first microphone signal whose SNR has been improved once more over the particular frequency band. This embodiment is not limited to using the third microphone for improving the SNR once more. These steps may be repeated as needed, thereby further improving the SNR and sound quality of the microphone.

Compared with the related art, the embodiments synthesize a voice signal by adding the voice signals of two microphones with a large difference in their SNRs, which can effectively improve the SNR of the voice signal acquired by the first microphone, so as to obtain better sound quality. In addition, the embodiments perform the signal addition over the particular frequency band which has a small influence on the specific function of the microphone to be improved and in which the SNR of the microphone to be improved is relatively low, so as to maintain the original performance characteristic of the microphone to be improved and at the same time improve the SNR of the voice signal. Moreover, the embodiments may improve the SNR once more by using another microphone. The signal addition may be performed with the first microphone whose SNR has been improved and another microphone according to actual requirements, thereby further improving the SNR and sound quality of the microphone to be improved.

Figure 4:
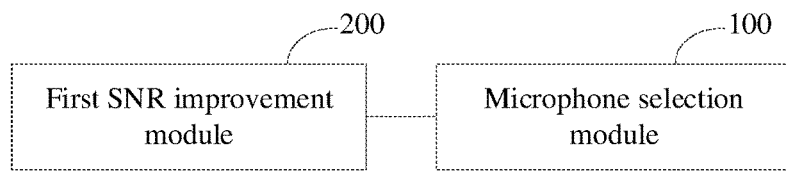
FIG. 4 is a schematic structural diagram of an apparatus for improving a signal-to-noise ratio of a microphone signal according to an embodiment of the present disclosure.

As shown in FIG. 4, an embodiment provides an apparatus for improving a signal-to-noise ratio of a microphone signal, including a microphone selection module 100 and a first SNR improvement module 200.

The microphone selection module 100 is configured to select a target microphone to be improved as a first microphone, and selecting a microphone whose SNR is greater than a SNR of the first microphone and exceeds a preset first threshold as a second microphone.

The first SNR improvement module 200 is configured to add, by an adder, a voice signal of the first microphone and a voice signal of the second microphone in a case that a same voice signal is inputted, to obtain a first microphone signal whose SNR has been improved.

Figure 5:
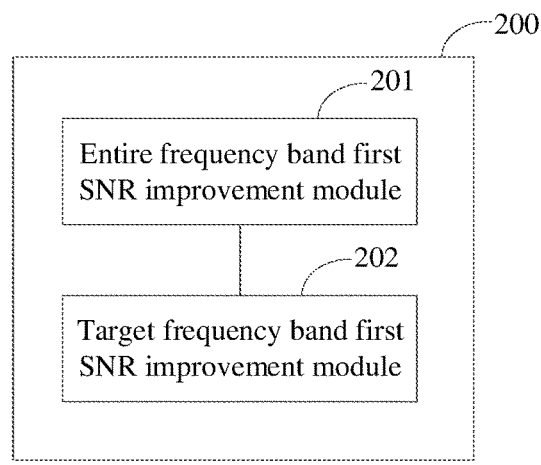
FIG. 5 is a schematic structural diagram of a first SNR improvement module according to an embodiment of the present disclosure.

In an embodiment, as shown in FIG. 5, the first SNR improvement module 200 includes an entire frequency band first SNR improvement module 201.

The entire frequency band first SNR improvement module 201 is configured to add, by the adder, an entire frequency band voice signal of the first microphone and an entire frequency band voice signal of the second microphone, to obtain the first microphone signal whose SNR has been improved.

In an embodiment, as shown in FIG. 5, the first SNR improvement module 200 includes a target frequency band first SNR improvement module 202.

The target frequency band first SNR improvement module 202 is configured to use frequency selective filters to respectively select a target frequency band voice signal of the first microphone and a target frequency band voice signal of the second microphone, in a case that the same voice signal is inputted; and add, by the adder, the target frequency band voice signal of the first microphone and the target frequency band voice signal of the second microphone, to obtain the first microphone signal whose SNR has been improved.

Figure 6:
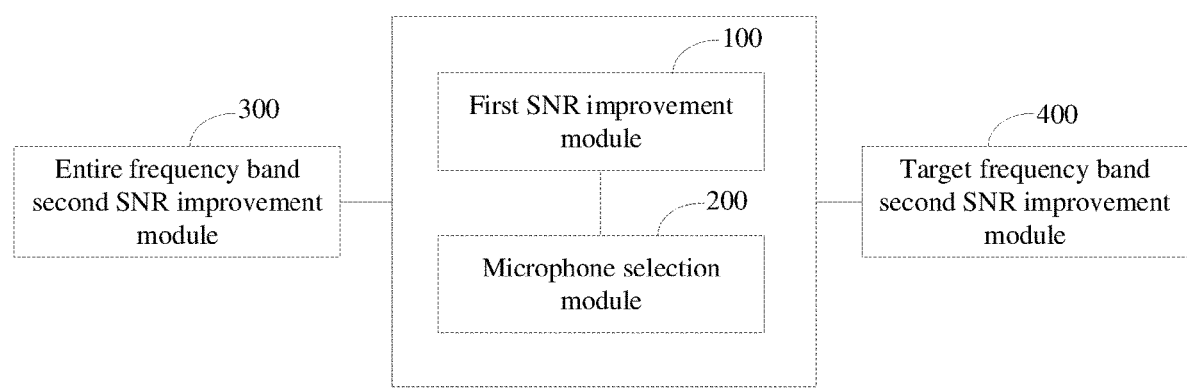
FIG. 6 is a schematic structural diagram of an apparatus for improving a signal-to-noise ratio of a microphone signal according to another embodiment of the present disclosure.

In an embodiment, as shown in FIG. 6, the apparatus for improving a signal-to-noise ratio of a microphone signal further includes an entire frequency band second SNR improvement module 300.

The microphone selection module 100 is further configured to select a microphone whose SNR is greater than a SNR of the first microphone whose SNR has been improved and exceeds a preset second threshold as a third microphone.

The entire frequency band second SNR improvement module 300 is configured to add, by the adder, an entire frequency band voice signal of the first microphone whose SNR has been improved and an entire frequency band voice signal of the third microphone, to obtain a first microphone signal whose SNR has been improved once more.

In an embodiment, as shown in FIG. 6, the apparatus for improving a signal-to-noise ratio of a microphone signal further includes a target frequency band second SNR improvement module 400.

The microphone selection module 100 is further configured to select a microphone whose SNR is greater than a SNR of the first microphone whose SNR has been improved and exceeds a preset second threshold as a third microphone.

The target frequency band second SNR improvement module 400 is configured to use frequency selective filters to respectively select a target frequency band voice signal of the first microphone whose SNR has been improved and a target frequency band voice signal of the third microphone, in a case that the same voice signal is inputted; and add, by the adder, the target frequency band voice signal of the first microphone whose SNR has been improved and the target frequency band voice signal of the third microphone, to obtain a first microphone signal whose SNR has been improved once more.

In another embodiment, the forgoing apparatus for improving a signal-to-noise ratio of a microphone signal includes a processor. The processor is configured to execute the forgoing program modules stored in a memory. The program modules include the microphone selection module 100, the first SNR improvement module 200, the entire frequency band first SNR improvement module 201, the target frequency band first SNR improvement module 202, the entire frequency band second SNR improvement module 300, and the target frequency band second SNR improvement module 400.

The embodiments synthesize a voice signal by adding the voice signals of two microphones with a large difference in their SNRs, which can effectively improve the SNR of the voice signal acquired by the microphone to be improved, so as to obtain better sound quality. In addition, the embodiments perform the signal addition over the target frequency band which has a small influence on the specific function of the microphone to be improved and in which the SNR of the microphone to be improved is relatively low, so as to maintain the original performance characteristic of the microphone to be improved and at the same time improve the SNR of the voice signal. Moreover, the embodiments may improve the SNR once more by using another microphone. The signal addition may be performed with the first microphone whose SNR has been improved and another microphone according to actual requirements, thereby further improving the SNR and sound quality of the microphone to be improved.

In an embodiment, the present disclosure also provides a computer-readable storage medium, storing a computer-readable instruction. The computer-readable instruction, when executed by a processor, causes the processor to perform the operations in the method as described in any of the foregoing embodiments.

The descriptions in the foregoing embodiments have their own focus. The foregoing embodiments may refer to each other.

In the embodiments provided in the present disclosure, the described technical content may be implemented in other ways. The foregoing apparatus embodiments are merely illustrative. For example, the modules may be in a logical function division manner. However, there may be other division manners in actual implementation. For example, multiple modules or components may be combined or integrated into another system, or some features may be ignored or not implemented. In addition, mutual coupling or direct coupling or communication connection may be through interfaces. The indirect coupling or communication connection between units or modules may be in electrical form or other forms.

The modules described as separate components may or may not be physically separated. The components displayed as modules may or may not be physical modules, that is, they may be located at one position, or may be distributed on multiple modules. Some or all of the modules may be selected according to actual needs to realize the solutions of the present disclosure.

In addition, each functional module in the foregoing embodiments of the present disclosure may be integrated into one processing module, or may exist alone physically. Alternatively, two or more functional modules may be integrated into one module. The integrated modules may be implemented in the form of hardware or software function modules.

The foregoing are only illustrative embodiments of the present disclosure. Any improvements and modification that are made by those skilled in the art without departing from the principle of the present disclosure are within the protection scope of the present disclosure.

It will be appreciated that all or part of the processes in the foregoing method embodiments may be implemented by instructing relevant hardware through a computer program. The program may be stored in a computer-readable storage medium. The computer program when executed may include the steps of the computer program method embodiments. The storage medium may be a magnetic disk, an optical disc, a read-only memory (ROM), or a random-access memory (RAM), etc.

What is claimed is:

1. A method for improving a signal-to-noise ratio of a microphone signal, comprising:
    selecting a target microphone to be improved as a first microphone, and selecting a microphone whose signal-to-noise ratio is greater than a signal-to-noise ratio of the first microphone and exceeds a preset first threshold as a second microphone; and
    adding, by an adder, a voice signal of the first microphone and a voice signal of the second microphone in a case that a same voice signal is inputted, to obtain a first microphone signal whose signal-to-noise ratio has been improved;
    wherein the adding, by an adder, a voice signal of the first microphone and a voice signal of the second microphone in a case that a same voice signal is inputted comprises:
    using frequency selective filters to respectively select a target frequency band voice signal of the first microphone and a target frequency band voice signal of the second microphone, in a case that the same voice signal is inputted; wherein the target frequency band voice signal of the first microphone is selected according to a frequency band that needs to be output, and the target frequency band voice signal of the second microphone is selected according to a particular frequency band to be improved; and
    adding, by the adder, the target frequency band voice signal of the first microphone and the target frequency band voice signal of the second microphone, to obtain the first microphone signal whose signal-to-noise ratio has been improved.

2. A method for improving a signal-to-noise ratio of a microphone signal, comprising:
    selecting a target microphone to be improved as a first microphone, and selecting a microphone whose signal-to-noise ratio is greater than a signal-to-noise ratio of the first microphone and exceeds a preset first threshold as a second microphone; and
    adding, by an adder, a voice signal of the first microphone and a voice signal of the second microphone in a case that a same voice signal is inputted, to obtain a first microphone signal whose signal-to-noise ratio has been improved;
    wherein the adding, by an adder, a voice signal of the first microphone and a voice signal of the second microphone in a case that a same voice signal is inputted comprises:
    adding, by the adder, an entire frequency band voice signal of the first microphone and an entire frequency band voice signal of the second microphone, to obtain the first microphone signal whose signal-to-noise ratio has been improved.

3. The method according to claim 2, further comprising:
    selecting a microphone whose signal-to-noise ratio is greater than a signal-to-noise ratio of the first microphone whose signal-to-noise ratio has been improved and exceeds a preset second threshold as a third microphone; and adding, by the adder, an entire frequency band voice signal of the first microphone whose signal-to-noise ratio has been improved and an entire frequency band voice signal of the third microphone, to obtain a first microphone signal whose signal-to-noise ratio has been improved once more.

4. The method according to claim 1, further comprising:
selecting a microphone whose signal-to-noise ratio is greater than a signal-to-noise ratio of the first microphone whose signal-to-noise ratio has been improved and exceeds a preset second threshold as a third microphone; and adding, by the adder, an entire frequency band voice signal of the first microphone whose signal-to-noise ratio has been improved and an entire frequency band voice signal of the third microphone, to obtain a first microphone signal whose signal-to-noise ratio has been improved once more.

5. The method according to claim 2, further comprising:
selecting a microphone whose signal-to-noise ratio is greater than a signal-to-noise ratio of the first microphone whose signal-to-noise ratio has been improved and exceeds a preset second threshold as a third microphone;

using frequency selective filters to respectively select a target frequency band voice signal of the first microphone whose signal-to-noise ratio has been improved and a target frequency band voice signal of the third microphone, in a case that the same voice signal is inputted; and adding, by the adder, the target frequency band voice signal of the first microphone whose signal-to-noise ratio has been improved and the target frequency band voice signal of the third microphone, to obtain a first microphone signal whose signal-to-noise ratio has been improved once more.

6. The method according to claim 1, further comprising:
selecting a microphone whose signal-to-noise ratio is greater than a signal-to-noise ratio of the first microphone whose signal-to-noise ratio has been improved and exceeds a preset second threshold as a third microphone;

using frequency selective filters to respectively select a target frequency band voice signal of the first microphone whose signal-to-noise ratio has been improved and a target frequency band voice signal of the third microphone, in a case that the same voice signal is inputted; and adding, by the adder, the target frequency band voice signal of the first microphone whose signal-to-noise ratio has been improved and the target frequency band voice signal of the third microphone, to obtain a first microphone signal whose signal-to-noise ratio has been improved once more.

7. The method according to claim 1, wherein the adder comprises a digital adder and an analog operational amplifier adder.

8. An apparatus for improving a signal-to-noise ratio of a microphone signal, comprising:
a microphone selection module, configured to select a target microphone to be improved as a first microphone, and select a microphone whose signal-to-noise ratio is greater than a signal-to-noise ratio of the first microphone and exceeds a preset first threshold as a second microphone; and a first signal-to-noise ratio improvement module, configured to add, by an adder, a voice signal of the first microphone and a voice signal of the second microphone in a case that a same voice signal is inputted, to obtain a first microphone signal whose signal-to-noise ratio has been improved;

wherein the first signal-to-noise ratio improvement module comprises:
a target frequency band first signal-to-noise ratio improvement module, configured to use frequency selective filters to respectively select a target frequency band voice signal of the first microphone and a target frequency band voice signal of the second microphone, in a case that the same voice signal is inputted; and add, by the adder, the target frequency band voice signal of the first microphone and the target frequency band voice signal of the second microphone, to obtain a first microphone signal whose signal-to-noise ratio has been improved;

wherein the target frequency band voice signal of the first microphone is selected according to a frequency band that needs to be output, and the target frequency band voice signal of the second microphone is selected according to a particular frequency band to be improved.

9. The apparatus according to claim 8, further comprising an entire frequency band second signal-to-noise ratio improvement module;

the microphone selection module, further configured to select a microphone whose signal-to-noise ratio is greater than a signal-to-noise ratio of the first microphone whose signal-to-noise ratio has been improved and exceeds a preset second threshold as a third microphone; and the entire frequency band second signal-to-noise ratio improvement module, configured to add, by the adder, an entire frequency band voice signal of the first microphone whose signal-to-noise ratio has been improved and an entire frequency band voice signal of the third microphone, to obtain a first microphone signal whose signal-to-noise ratio has been improved once more.

10. The apparatus according to claim 8, further comprising a target frequency band second signal-to-noise ratio improvement module;

the microphone selection module, further configured to select a microphone whose signal-to-noise ratio is greater than a signal-to-noise ratio of the first microphone whose signal-to-noise ratio has been improved and exceeds a preset second threshold as a third microphone; and the target frequency band second signal-to-noise ratio improvement module, configured to use frequency selective filters to respectively select a target frequency band voice signal of the first microphone whose signal-to-noise ratio has been improved and a target frequency band voice signal of the third microphone, in a case that the same voice signal is inputted; and add, by the adder, the target frequency band voice signal of the first microphone whose signal-to-noise ratio has been improved and the target frequency band voice signal of the third microphone, to obtain a first microphone signal whose signal-to-noise ratio has been improved once more.

\* \* \* \* \*